United States Patent
Lee et al.

(10) Patent No.: US 9,288,906 B2
(45) Date of Patent: Mar. 15, 2016

(54) MOUNTING CIRCUIT BOARD OF MULTILAYER CERAMIC CAPACITOR

(71) Applicant: SAMSUNG ELECTRO-MECHANICS CO., LTD., Suwon, Gyunggi-do (KR)

(72) Inventors: Byoung Hwa Lee, Gyunggi-do (KR); Heung Kil Park, Gyunggi-do (KR); Soon Ju Lee, Gyunggi-do (KR); Young Ghyu Ahn, Gyunggi-do (KR); Sang Soo Park, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 5 days.

(21) Appl. No.: 14/146,534

(22) Filed: Jan. 2, 2014

(65) Prior Publication Data

US 2015/0047887 A1    Feb. 19, 2015

(30) Foreign Application Priority Data

Aug. 14, 2013   (KR) .................. 10-2013-0096726

(51) Int. Cl.
*H05K 1/11* (2006.01)
*H05K 3/34* (2006.01)
*H01G 4/008* (2006.01)
(Continued)

(52) U.S. Cl.
CPC ............. *H05K 1/111* (2013.01); *H01G 4/0085* (2013.01); *H01G 4/12* (2013.01); *H01G 4/232* (2013.01); *H05K 3/3442* (2013.01); *H05K 2201/10015* (2013.01); *H05K 2201/2045* (2013.01)

(58) Field of Classification Search
CPC ............................................... H01G 4/00–4/40
See application file for complete search history.

(56) References Cited

U.S. PATENT DOCUMENTS

2001/0033219 A1* 10/2001 Iha et al. .................... 336/90
2004/0042156 A1*  3/2004 Devoe et al. .............. 361/321.2
2006/0120023 A1*  6/2006 Kobayashi et al. ........... 361/523

(Continued)

FOREIGN PATENT DOCUMENTS

JP          5-217788 A          8/1993
JP          11-340106          12/1999

(Continued)

OTHER PUBLICATIONS

Office Action issued on Jul. 21, 2014 in the corresponding Korean patent application No. 10-2013-0096726.

(Continued)

*Primary Examiner* — Jeremy C Norris
*Assistant Examiner* — Muhammed Azam
(74) *Attorney, Agent, or Firm* — McDermott Will & Emery LLP (57) ABSTRACT

A mounting circuit board of a multilayer ceramic capacitor includes a multilayer ceramic capacitor including a ceramic body in which a plurality of dielectric layers are stacked, an active layer including a plurality of first and second internal electrodes alternately exposed to both end surfaces of the ceramic body, having the dielectric layer therebetween, and first and second external electrodes extended from both end surfaces of the ceramic body to a portion of a lower surface thereof; and a printed circuit board having first and second electrode pads so that the first and second external electrodes are mounted thereon, wherein the first and second electrode pads are disposed in positions diagonally opposed to each other, based on the ceramic body.

4 Claims, 6 Drawing Sheets

(51) Int. Cl.
*H01G 4/12* (2006.01)
*H01G 4/232* (2006.01)

(56) References Cited

U.S. PATENT DOCUMENTS

| | | | |
|---|---|---|---|
| 2006/0256504 A1* | 11/2006 | Kojima | 361/311 |
| 2007/0236864 A1* | 10/2007 | Goetz | 361/321.1 |
| 2007/0297119 A1* | 12/2007 | Maegawa et al. | 361/306.3 |
| 2008/0074826 A1 | 3/2008 | Lee et al. | |
| 2012/0057268 A1 | 3/2012 | Tsutsumi | |
| 2012/0152604 A1 | 6/2012 | Ahn et al. | |
| 2012/0300361 A1* | 11/2012 | Togashi | 361/301.4 |
| 2013/0056252 A1 | 3/2013 | Fujii et al. | |
| 2014/0268487 A1 | 9/2014 | Yoshida | |

FOREIGN PATENT DOCUMENTS

| | | |
|---|---|---|
| JP | 2012-134498 A | 7/2012 |
| JP | 2012-248581 A | 12/2012 |
| JP | 2013-65820 A | 4/2013 |
| JP | 2014-179512 A | 9/2014 |
| KR | 2008-0027030 A | 3/2008 |
| KR | 10-2012-0024475 | 3/2012 |
| KR | 2013-0025328 A | 3/2013 |

OTHER PUBLICATIONS

Notice of Office Action Japanese Patent Application No. 2013-269344 dated Jun. 30, 2015 with full English translation.

* cited by examiner

MOUNTING CIRCUIT BOARD OF MULTILAYER CERAMIC CAPACITOR

CROSS-REFERENCE TO RELATED APPLICATION

This application claims the benefit of Korean Patent Application No. 10-2013-0096726 filed on Aug. 14, 2013, with the Korean Intellectual Property Office, the disclosure of which is incorporated herein by reference.

BACKGROUND

The present disclosure relates to a mounting circuit board of a multilayer ceramic capacitor.

Multilayer ceramic capacitors, multilayer chip electronic components, are chip-shaped condensers mounted on printed circuit boards of various electronic products such as display devices, for example, liquid crystal displays (LCD), plasma display panels (PDP), or the like, computers, personal digital assistants (PDA), mobile phones, and the like, to serve to charge electricity or discharge electricity.

Since such multilayer ceramic capacitors (MLCC) have advantages such as a small size, high capacitance, easiness of mounting, or the like, the multilayer ceramic capacitors may be used as components of various electronic devices.

The multilayer ceramic capacitors may have a structure in which a plurality of dielectric layers and internal electrodes having different polarities to be interposed between the dielectric layers are alternately stacked.

Since the dielectric layers as described above have piezoelectricity and electrostriction, when a direct current (DC) voltage or an alternate current (AC) voltage is applied to the multilayer ceramic capacitors, piezoelectric phenomena are generated between the internal electrodes to cause the occurrence of vibrations.

Such vibrations are transferred to printed circuit boards on which the multilayer ceramic capacitors are mounted, through external electrodes of the multilayer ceramic capacitors, such that the entire printed circuit boards act as sound reflective surfaces to generate vibration sound, noise.

The vibration sound may have a frequency corresponding to an audio frequency in a region of 20 to 20,000 Hz causing listeners discomfort. The vibration sound causing listeners discomfort as described above is called acoustic noise.

A multilayer ceramic capacitor including first and second side surface electrodes formed on both side surfaces of a multilayer body and electrically connected to first and second internal conductors, respectively, and first and second main surface electrodes connected to the first and second side surface electrodes and formed in positions diagonally opposed to each other on at least one main surface of the multilayer body is disclosed in the following Related Art Document, but a structure in which first and second electrode pads of a printed circuit board according to the present disclosure are disposed to be diagonally opposed to each other, based on a ceramic body is not disclosed.

RELATED ART DOCUMENT

Korean Patent Laid-Open Publication No. 10-2012-0024475

SUMMARY

An aspect of the present disclosure may provide a new scheme, a mounting circuit board of a multilayer ceramic capacitor capable of decreasing noise generated by vibrations due to a piezoelectric phenomenon.

According to an aspect of the present disclosure, a mounting circuit board of a multilayer ceramic capacitor may include: a multilayer ceramic capacitor including a ceramic body in which a plurality of dielectric layers are stacked, an active layer including a plurality of first and second internal electrodes alternately exposed to both end surfaces of the ceramic body, having the dielectric layer interposed therebetween, and first and second external electrodes extended from both end surfaces of the ceramic body to a portion of a lower surface thereof; and a printed circuit board having first and second electrode pads so that the first and second external electrodes of the multilayer ceramic capacitor are mounted thereon, wherein the first and second electrode pads are disposed in positions diagonally opposed to each other, based on the ceramic body of the multilayer ceramic capacitor.

According to another aspect of the present disclosure, a mounting circuit board of a multilayer ceramic capacitor may include: a multilayer ceramic capacitor including a ceramic body in which a plurality of dielectric layers are stacked, an active layer including a plurality of first and second internal electrodes alternately exposed to both side surfaces of the ceramic body, having the dielectric layer interposed therebetween, and first and second external electrodes extended from both side surfaces of the ceramic body to a portion of a lower surface thereof; and a printed circuit board having first and second electrode pads so that the first and second external electrodes of the multilayer ceramic capacitor are mounted thereon, wherein the first and second electrode pads are disposed in positions diagonally opposed to each other, based on the ceramic body of the multilayer ceramic capacitor.

The first and second electrode pads may be spaced apart from each other in a length direction of the ceramic body.

In this case, when an interval between the first and second electrode pads in the length direction of the ceramic body is defined as D, D may satisfy 50 µm≤D<300 µm.

In the case that a width of the ceramic body is defined as W, and a distance between a front end of the first electrode pad disposed on one side surface of the ceramic body and a front end of the second electrode pad disposed on the other side surface is defined as S, a ratio of W to S may satisfy $0.58 \leq W/S \leq 1.00$.

The multilayer ceramic capacitor may further include: an upper cover layer formed on the active layer; and a lower cover layer, having a thickness thicker than that of the upper cover layer, formed below the active layer.

When a half of the entire thickness of the ceramic body is defined as A, a thickness of the lower cover layer is defined as B, and a half of the entire thickness of the active layer is defined as C, a ratio of a central portion of the active layer deviating from a central portion of the ceramic body, (B+C)/A may satisfy $1.063 \leq (B+C)/A \leq 1.745$.

In the multilayer ceramic capacitor, the first and second external electrodes may be extended from both side surfaces of the ceramic body to portions of both end surfaces thereof.

In the multilayer ceramic capacitor, the first and second external electrodes may be spaced apart from each other in a length direction of the ceramic body.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe the exemplary embodiments of the present disclosure. L, W and T shown in the accompanying drawings refer to a length direction, a width direction, and a thickness direction, respectively. Here, the thickness direction may be the same as a direction in which dielectric layers are stacked.

Figure 2:
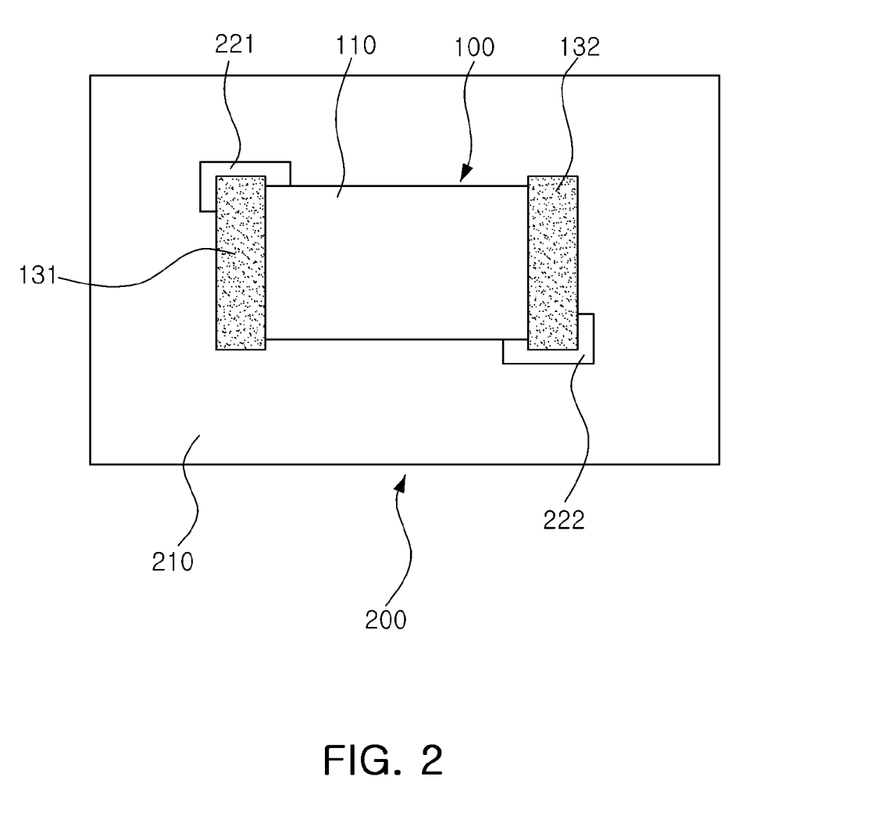
FIG. 2 is a plan view of FIG. 1.

Further, in the present exemplary embodiment, for convenience of explanation, surfaces on which first and second external electrodes are formed in the length direction of a ceramic body in FIG. 2 may be defined as both end surfaces, surfaces intersected with both end surfaces in a vertical direction thereof may be defined as both side surfaces, a portion in which a printed circuit board is disposed may be defined as a lower portion, and a portion in which a multilayer ceramic capacitor is positioned to be opposed thereto may be defined as an upper portion.

Mounting Circuit Board of Multilayer Ceramic Capacitor

Figure 1:
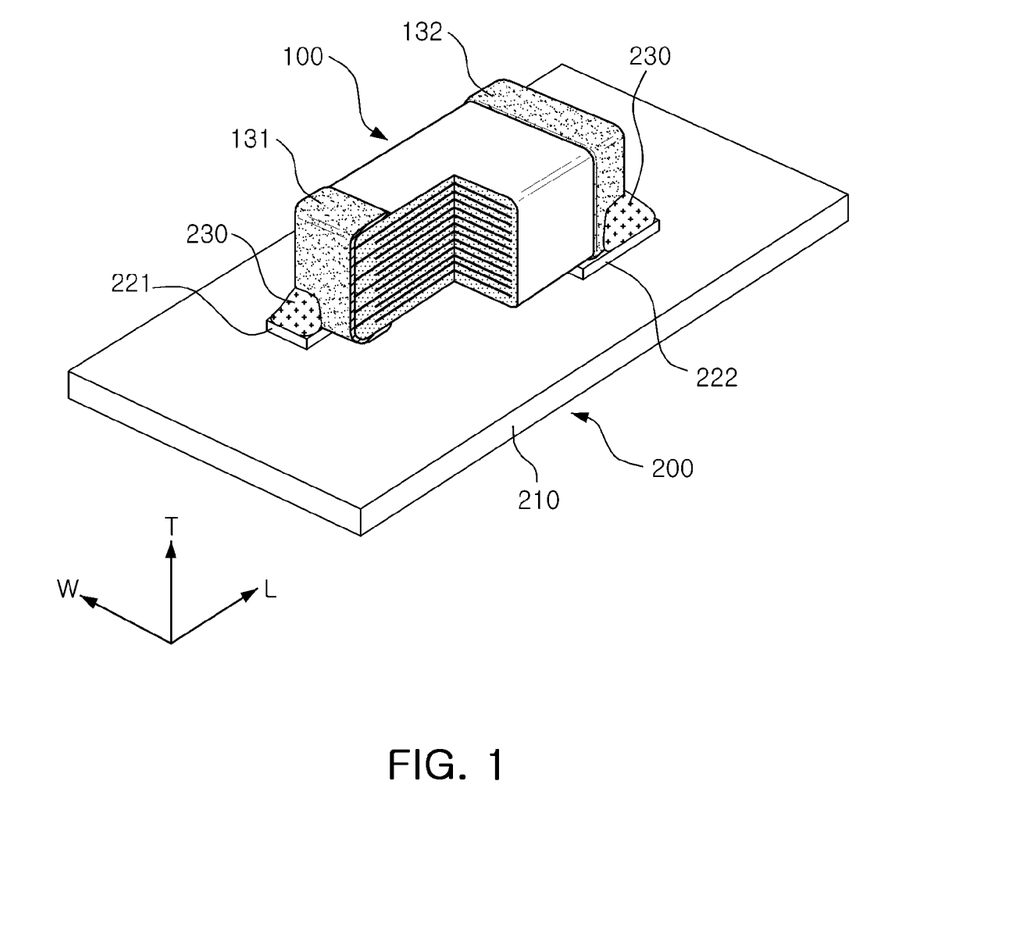
FIG. 1 is a partially cut-away perspective view schematically showing a multilayer ceramic capacitor mounted on amounting circuit board according to an exemplary embodiment of the present disclosure.

FIG. 1 is a partially cut-away perspective view schematically showing a multilayer ceramic capacitor according to an exemplary embodiment of the present disclosure, and FIG. 2 is a plan view of FIG. 1.

Referring to FIGS. 1 and 2, a mounting circuit board 200 of a multilayer ceramic capacitor 100 according to the exemplary embodiment of the present disclosure may include a multilayer ceramic capacitor 100 including a ceramic body 110, an active layer 115 having a plurality of first and second internal electrodes 121 and 122, and first and second external electrodes 131 and 132 extended from both end surfaces of the ceramic body 110 to portions of a lower surface, which is a mounting surface; and a printed circuit board 210 having first and second electrode pads 221 and 222 formed on an upper portion so that the first and second external electrodes 131 and 132 of the multilayer ceramic capacitor 100 are mounted thereon.

In this case, the first and second electrode pads 221 and 222 may be disposed in positions diagonally opposed to each other, based on the ceramic body 110 of the multilayer ceramic capacitor 100.

The ceramic body 110 may be formed by stacking and then firing a plurality of dielectric layers 111. In this case, a shape and a dimension of the ceramic body 110 and the number of stacked dielectric layers 111 are not limited to those of the present exemplary embodiment shown in the accompanying drawings.

In addition, the plurality of dielectric layers 111 configuring the ceramic body 110 may be in a sintered state. Adjacent dielectric layers 111 may be integrated so as to be difficult to confirm a boundary therebetween without using a scanning electron microscope (SEM).

The ceramic body 110 may include the active layer 115 as apart contributing to forming capacitance of the capacitor, and upper and lower cover layers 112 and 113 formed on and below the active layer 115, respectively, as upper and lower margin parts.

The active layer 115 may be formed by repeatedly stacking the plurality of first and second internal electrodes 121 and 122, having the dielectric layer 111 interposed therebetween.

In this case, a thickness of the dielectric layer 111 may be optionally changed according to a capacitance design of the multilayer ceramic capacitor 100, and a thickness of a single layer may be 0.01 to 1.00 µm after firing. However, the present disclosure is not limited thereto.

Further, the dielectric layer 111 may contain a ceramic powder having high permittivity, for example, a barium titanate ($BaTiO_3$)-based powder or a strontium titanate ($SrTiO_3$)-based powder, but the present disclosure is not limited thereto.

The upper and lower cover layers 112 and 113 may have the same material and configuration as those of the dielectric layer 111 except that internal electrodes are not included therein.

The upper and lower cover layers 112 and 113 may be formed by stacking a single dielectric layer or at least two dielectric layers on upper and lower surfaces of the active layer 115 in the thickness direction, respectively, and basically serve to prevent the first and second internal electrodes 121 and 122 from being damaged by physical or chemical stress.

The first and second internal electrodes 121 and 122 having different polarities from each other may be formed by printing a conductive paste containing a conductive metal on the dielectric layer 111 to a predetermined thickness so as to be alternately exposed to both end surfaces of the ceramic body 110 in the direction in which the dielectric layers 111 are stacked and may be electrically insulated from each other by the dielectric layer 111 interposed therebetween.

The first and second internal electrodes 121 and 122 may be electrically connected to first and second external electrodes 131 and 132 through portions alternately exposed to both end surfaces of the ceramic body 110, respectively.

Therefore, when a voltage is applied to the first and second external electrodes 131 and 132, electric charges are accumulated between the first and second internal electrodes 121 and 122 facing each other. In this case, capacitance of the multilayer ceramic capacitor 100 may be in proportion to an area of an overlapped region between the first and second internal electrodes 121 and 122 in the active layer 115.

A thickness of the first and second internal electrodes 121 and 122 as described above may be determined according to the use thereof. For example, the thickness thereof may be determined to be in a range of 0.2 to 1.0 μm in consideration of a size of the ceramic body 110, but the present disclosure is not limited thereto.

Further, the conductive metal included in the conductive paste forming the first and second internal electrodes 121 and 122 may be nickel (Ni), copper (Cu), palladium (Pd), or an alloy thereof, but the present disclosure is not limited thereto.

In addition, as a printing method of the conductive paste, a screen printing method, a gravure printing method, or the like, may be used, but the present disclosure is not limited thereto.

Meanwhile, the first and second external electrodes 131 and 132 may be formed of a conductive paste including a conductive metal, wherein the conductive metal may be nickel (Ni), copper (Cu), palladium (Pd), gold (Au), or an alloy thereof, but the present disclosure is not limited thereto.

In this case, the first and second external electrodes 131 and 132 may be extended to a portion of an upper surface of the ceramic body 110 as well as a portion of the lower surface thereof, thereby removing vertical directivity at the time of forming the ceramic body in a vertically symmetric structure to mount the capacitor on the printed circuit board 210.

The mounting circuit board 200 of the multilayer ceramic capacitor 100 according to the exemplary embodiment of the present disclosure may include the printed circuit board 210 on which the multilayer ceramic capacitor 100 is horizontally mounted and the first and second electrode pads 221 and 222 disposed on the printed circuit board 210 in positions diagonally opposed to each other, based on the ceramic body 110.

Further, in the case of adjusting sizes of portions of the first and second electrode pads 221 and 222 exposed to the outside rather than the portions thereof exposed to a lower surface of the ceramic body 110, a size and a height of a solder 230 may be adjusted, such that vibrations transferred from the multilayer ceramic capacitor 100 to the printed circuit board 210 may be adjusted.

In this case, the multilayer ceramic capacitor 100 may be electrically connected to the printed circuit board 210 by the solder 230 in a state in which the lower cover layer 113 is formed in a lower part thereof and portions of the first and second external electrodes 131 and 132 are positioned on the first and second electrode pads 221 and 222 so as to contact the first and second electrode pads 221 and 222, respectively.

When a voltage is applied in a state in which the multilayer ceramic capacitor 100 is mounted on the printed circuit board 210 as described above, acoustic noise may be generated.

Here, sizes of the first and second electrode pads 221 and 222 may be an indicator for determining an amount of the solder 230 connecting the first and second external electrodes 131 and 132 of the multilayer ceramic capacitor 100 to the first and second electrode pads 221 and 222, and a level of acoustic noise may be adjusted according to the amount of the solder 230.

Figure 3:
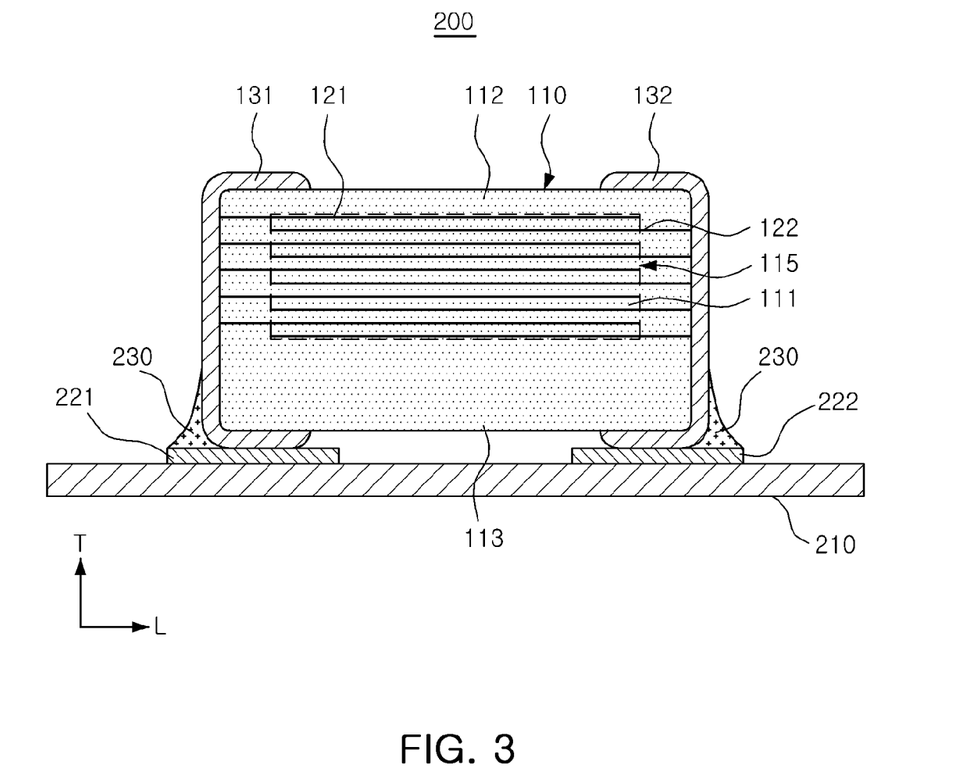
FIG. 3 is a cross-sectional view taken in a length direction of a mounting circuit board of a multilayer ceramic capacitor according to another exemplary embodiment of the present disclosure.

Meanwhile, referring to FIG. 3, the lower cover layer 113 may have a thickness thicker than that of the upper cover layer 112 by increasing the number of stacked dielectric layers as compared to the upper cover layer 112.

Hereinafter, a relationship between dimensions of components included in a multilayer ceramic capacitor according to another exemplary embodiment illustrated in FIG. 3 and acoustic noise will be described.

Figure 4:
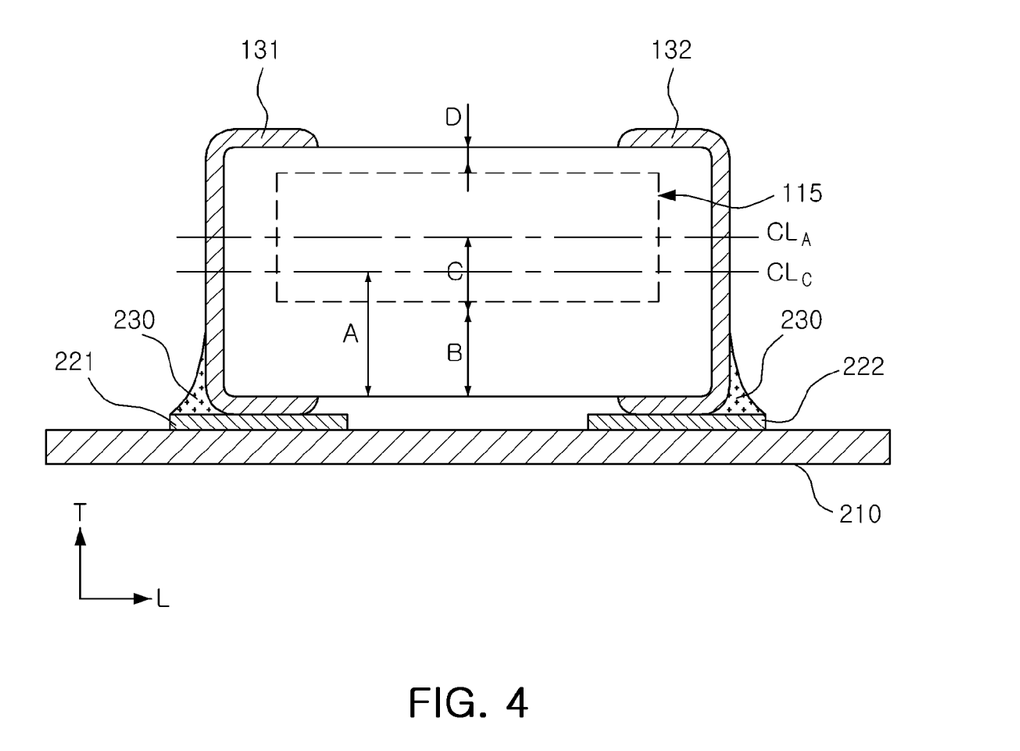
FIG. 4 is a schematic cross-sectional view taken in the length direction of the mounting circuit board of a multilayer ceramic capacitor of FIG. 3 in order to describe a dimensional relationship between components included in the mounting circuit board of a multilayer ceramic capacitor according to another exemplary embodiment of the present disclosure.

Referring to FIG. 4, a half of the entire thickness of a ceramic body 110 may be defined as A, a thickness of a lower cover layer 113 may be defined as B, and a half of the entire thickness of an active layer 115 may be defined as C.

Here, the entire thickness of the ceramic body 110 may refer to a distance from the upper surface of the ceramic body 110 to the lower surface thereof, and the entire thickness of the active layer 115 may refer to a distance from an upper surface of a first internal electrode 121 formed on an uppermost portion of the active layer 115 to a lower surface of a second internal electrode 122 formed on a lowermost portion of the active layer 115.

In addition, the thickness B of the lower cover layer 113 may refer to a distance from the lower surface of the second internal electrode 122 formed on the lowermost portion of the active layer 115 in the thickness direction to the lower surface of the ceramic body 110.

When voltages having different polarities are applied to the first and second external electrodes 131 and 132 formed on both end surfaces of the multilayer ceramic capacitor 100, the ceramic body 110 may be expanded and contracted in the thickness direction by an inverse piezoelectric effect of the dielectric layer 111, and both end surfaces of the ceramic body 110 may be expanded and contracted in a direction opposite to the expansion and contraction of the ceramic body 110 in the thickness direction, due to the Poisson effect.

Here, a central portion of the active layer 115 may be a portion significantly expanded and contracted from both end portions on which the first and second external electrodes 131 and 132 are formed, in the length direction of the ceramic body 110, and in the case in which the solder is adhered to this portion, since contraction and expansion behaviors of both end portions of the ceramic body 110 in the length direction may be mostly transferred to the printed circuit board through the solder, generation of acoustic noise may be significantly increased.

For example, according to the exemplary embodiment of the present disclosure, in order to decrease acoustic noise, points of inflection (PI) formed on both end surfaces of the ceramic body 110 may be formed in positions lower than a central portion $CL_c$ of the ceramic body 110 in the thickness direction due to a difference between strain generated at the central portion $CL_A$ of the active layer 115 and strain generated on the lower cover layer 113 at the time of applying voltage.

In this case, in order to further decrease acoustic noise, a ratio of the central portion $CL_A$ of the active layer 115 deviating from the central portion $CL_c$ of the ceramic body 110, for example, (B+C)/A may satisfy $1.063 \leq (B+C)/A \leq 1.745$.

Multilayer ceramic capacitors in Examples according to another exemplary embodiment of the present disclosure and Comparative Examples were manufactured as follows.

A slurry containing a powder such as barium titanate (BaTiO$_3$), or the like, was applied to a carrier film to then be dried thereon so as to prepare a plurality of ceramic green sheets having a thickness of 1.8 μm.

Then, a conductive paste for a nickel internal electrode was applied onto the ceramic green sheet using a screen printing method, thereby forming first and second internal electrodes 121 and 122 so as to be alternately exposed to both end surfaces of the ceramic green sheet.

A multilayer body was formed by stacking about 370 ceramic green sheets, but a greater amount of ceramic green sheets on which the first and second internal electrode 121 and 122 were not formed were stacked on a lower portion of the ceramic green sheets on which the first and second internal electrode 121 and 122 were formed, as compared to an amount thereof stacked on an upper portion thereof.

The isostatic pressing was performed on the multilayer body formed as described above at about 85° C. and a pressure of about 1000 kgf/cm².

Thereafter, the multilayer body completed in the pressing process was cut into respective single chips, and the cut chip was subjected to a de-binding process to be maintained at 230° C. for 60 hours under an air atmosphere.

Then, the multilayer body was fired at about 1200° C. under a reduction atmosphere having oxygen partial pressure of $10^{-11}$ atm to $-10^{-10}$ atm lower than Ni/NiO equilibrium oxygen partial pressure so that the first and second internal electrodes 121 and 122 and first and second dummy patterns 123 and 124 were not oxidized, thereby preparing a ceramic body 110.

A size of the ceramic body 110 after firing was about 1.64 mm×0.88 mm (Length×Width (L×W), 1608 size). Next, after a multilayer ceramic capacitor 100 was manufactured by forming first and second external electrodes 131 and 132 on both end surfaces of the ceramic body 110, respectively, the first and second external electrodes 131 and 132 were mounted on first and second electrode pads 221 and 222 of a printed circuit board 210.

In this case, a manufacturing tolerance of the multilayer ceramic capacitor 100 was in a range of ±0.1 mm (L×W), and experiments were performed on samples satisfying this range, such that acoustic noise was measured in respective samples.

Data of table 1 above were obtained by measuring each dimension from a photograph obtained by scanning a cross-section of the ceramic body 110 in the length-thickness (L-T) directions, taken along a central portion of the ceramic body 110 of the multilayer ceramic capacitor 100 in a width (W) direction using a scanning electron microscope (SEM) as shown in FIG. 4.

Here, a half of the entire thickness of the ceramic body 110 was defined as A, a thickness of the lower cover layer 113 was defined as B, a half of the entire thickness of the active layer 115 was defined as C, and a thickness of the upper cover layer 112 was defined as D, as described above.

In order to measure acoustic noise, after one sample (multilayer ceramic capacitor) per a board for measurement of acoustic noise was mounted on a printed circuit board in a vertical direction, the board was mounted on a jig for measurement.

In addition, a DC voltage and voltage variation were applied to both terminals of the sample mounted on the jig for measurement by using a DC power supply and a function generator. Acoustic noise was measured through a mike installed directly on the printed circuit board.

In table 1 above, samples 1 to 3 were Comparative Examples of a capacitor having a cover symmetrical structure in which the thickness B of the lower cover layer 113 and the thickness D of the upper cover layer 112 were significantly similar to each other, and samples 4 to 13 were Comparative Examples of a capacitor having a structure in which the

TABLE 1

| Sample | A (μm) | B (μm) | C (μm) | D (μm) | (B + C)/A | B/A | D/B | C/B | AN (dB) | Capacitance implementation ratio |
|---|---|---|---|---|---|---|---|---|---|---|
| 1* | 405.5 | 40.2 | 355.4 | 39.9 | 1.000 | 0.099 | 0.993 | 9.090 | 29.5 | OK |
| 2* | 436.0 | 70.4 | 365.9 | 69.7 | 1.001 | 0.161 | 0.990 | 5.197 | 25.7 | OK |
| 3* | 455.5 | 90.8 | 364.3 | 91.5 | 0.999 | 0.199 | 1.008 | 4.012 | 23.1 | OK |
| 4* | 508.1 | 24.9 | 361.1 | 269.1 | 0.760 | 0.049 | 10.807 | 14.502 | 31.2 | OK |
| 5* | 456.6 | 25.2 | 360.1 | 167.8 | 0.844 | 0.055 | 6.659 | 14.290 | 32.5 | OK |
| 6* | 527.3 | 30.2 | 191.0 | 642.4 | 0.419 | 0.057 | 21.272 | 6.325 | 30.3 | OK |
| 7* | 414.5 | 30.9 | 188.8 | 420.4 | 0.530 | 0.075 | 13.805 | 6.110 | 30.5 | OK |
| 8* | 516.2 | 39.4 | 360.7 | 271.5 | 0.775 | 0.076 | 6.891 | 9.155 | 28.2 | OK |
| 9* | 446.0 | 39.8 | 365.5 | 121.2 | 0.909 | 0.089 | 3.045 | 9.183 | 29.1 | OK |
| 10* | 469.1 | 40.6 | 364.2 | 169.1 | 0.863 | 0.087 | 4.165 | 8.970 | 27.9 | OK |
| 11* | 416.2 | 40.7 | 360.7 | 70.3 | 0.964 | 0.098 | 1.727 | 8.862 | 28.4 | OK |
| 12* | 428.3 | 40.8 | 360.0 | 95.7 | 0.936 | 0.095 | 2.346 | 8.824 | 28.9 | OK |
| 13* | 495.9 | 40.9 | 364.9 | 221.0 | 0.818 | 0.082 | 5.403 | 8.922 | 28.1 | OK |
| 14* | 435.9 | 25.0 | 421.3 | 4.2 | 1.024 | 0.057 | 0.168 | 16.852 | 31.6 | OK |
| 15* | 420.7 | 70.4 | 365.9 | 39.1 | 1.037 | 0.167 | 0.555 | 5.197 | 25.7 | OK |
| 16* | 431.7 | 94.8 | 354.3 | 40.0 | 1.063 | 0.220 | 0.422 | 3.843 | 19.9 | OK |
| 17* | 443.0 | 103.8 | 389.1 | 4.0 | 1.113 | 0.234 | 0.039 | 3.749 | 19.3 | OK |
| 18* | 443.7 | 119.8 | 363.2 | 41.1 | 1.089 | 0.270 | 0.343 | 3.032 | 18.7 | OK |
| 19* | 447.1 | 147.3 | 362.1 | 22.7 | 1.139 | 0.329 | 0.154 | 2.458 | 17.9 | OK |
| 20* | 452.8 | 164.7 | 360.2 | 20.4 | 1.159 | 0.354 | 0.124 | 2.187 | 17.3 | OK |
| 21* | 448.7 | 170.3 | 361.0 | 5.1 | 1.184 | 0.380 | 0.030 | 2.120 | 17.2 | OK |
| 22* | 470.7 | 170.4 | 365.4 | 40.2 | 1.138 | 0.362 | 0.236 | 2.144 | 17.4 | OK |
| 23* | 491.9 | 220.3 | 360.8 | 41.8 | 1.181 | 0.448 | 0.190 | 1.638 | 16.9 | OK |
| 24* | 500.6 | 270.2 | 360.5 | 9.9 | 1.260 | 0.540 | 0.037 | 1.334 | 16.8 | OK |
| 25* | 516.9 | 270.4 | 361.8 | 39.7 | 1.223 | 0.523 | 0.147 | 1.338 | 16.7 | OK |
| 26* | 502.1 | 364.9 | 312.3 | 14.7 | 1.349 | 0.727 | 0.040 | 0.856 | 16.6 | OK |
| 27* | 407.5 | 421.8 | 189.1 | 14.9 | 1.499 | 1.035 | 0.035 | 0.448 | 16.6 | OK |
| 28* | 445.8 | 493.3 | 179.3 | 39.7 | 1.509 | 1.107 | 0.080 | 0.363 | 16.5 | OK |
| 29* | 483.7 | 632.0 | 160.1 | 15.2 | 1.638 | 1.307 | 0.024 | 0.253 | 16.4 | OK |
| 30* | 520.0 | 643.4 | 190.7 | 15.2 | 1.604 | 1.237 | 0.024 | 0.296 | 16.4 | OK |
| 31* | 486.4 | 685.3 | 121.1 | 45.3 | 1.658 | 1.409 | 0.066 | 0.177 | 16.4 | OK |
| 32* | 507.2 | 742.7 | 120.8 | 30.1 | 1.702 | 1.464 | 0.041 | 0.163 | 16.4 | OK |
| 33* | 515.2 | 773.9 | 118.2 | 20.1 | 1.732 | 1.502 | 0.026 | 0.153 | 16.4 | OK |
| 34* | 524.5 | 798.2 | 116.9 | 16.9 | 1.745 | 1.522 | 0.021 | 0.146 | 16.3 | OK |
| 35* | 533.4 | 832.4 | 109.8 | 14.8 | 1.766 | 1.561 | 0.018 | 0.132 | 16.3 | NG |
| 36* | 533.8 | 841.1 | 105.3 | 14.9 | 1.775 | 1.577 | 0.018 | 0.125 | 16.3 | NG |
| 37* | 534.1 | 849.7 | 101.2 | 16.1 | 1.780 | 1.591 | 0.019 | 0.119 | 16.3 | NG |

Here, *indicates Comparative Example, and AN indicates acoustic noise.

thickness D of the upper cover layer 112 was thicker than the thickness B of the lower cover layer 113.

Further, samples 14 and 15, and 35 to 37 were Comparative Examples of a capacitor having a structure in which the thickness B of the lower cover layer 113 was thicker than the thickness D of the upper cover layer 112, and samples 16 to 34 were Examples of the capacitor according to the exemplary embodiment of the present disclosure.

Here, (B+C)/A may be approximately 1 and this case indicates that the central portion of the active layer 115 does not largely deviate from the central portion of the ceramic body 110. In samples 1 to 3 having the cover symmetrical structure in which the thickness B of the lower cover layer 113 and the thickness D of the upper cover layer 112 were significantly similar to each other, (B+C)/A was approximately 1.

(B+C)/A may be greater than 1, which may indicate that the central portion of the active layer 115 deviates upwardly from the central portion of the ceramic body 110, and (B+C)/A may be less than 1, which may indicate that the central portion of the active layer 115 deviates downwardly from the central portion of the ceramic body 110.

Referring to Table 1, it may be confirmed that in samples 16 to 34 of embodiments in which the ratio of the central portion of the active layer 115 deviating from the central portion of the ceramic body 110, for example, (B+C)/A was in the range of 1.063 to 1.745 (1.063≤(B+C)/A≤1.745), acoustic noise was significantly decreased to be less than 20 dB.

In addition, samples 1 to 15 in which the ratio of the central portion of the active layer 115 deviating from the central portion of the ceramic body 110, for example, (B+C)/A was less than 1.063, had a structure in which the central portion of the active layer 115 slightly deviated from the central portion of the ceramic body 110 or the central portion of the active layer 115 deviated downwardly from the central portion of the ceramic body 110.

In samples 1 to 15 in which (B+C)/A was less than 1.063, acoustic noise was 25 to 32.5 dB. Therefore, it may be appreciated that there was no effect of decreasing acoustic noise in these samples as compared to the Examples according to the exemplary embodiment of the present disclosure.

In addition, in samples 35 to 37 in which the ratio of the central portion of the active layer 115 deviating from the central portion of the ceramic body 110, for example, (B+C)/A is more than 1.745, a ratio of capacitance to the target capacitance was low, such that a defect with respect to capacitance occurred.

In table 1 above, the case in which a capacitance implementation ratio (for example, a ratio of capacitance to the target capacitance) was indicated as "NG" refers to the case in which the ratio of the capacitance to the target capacitance was less than 80% in the case that the target capacitance value was 100%.

Modified Example

Figure 5:
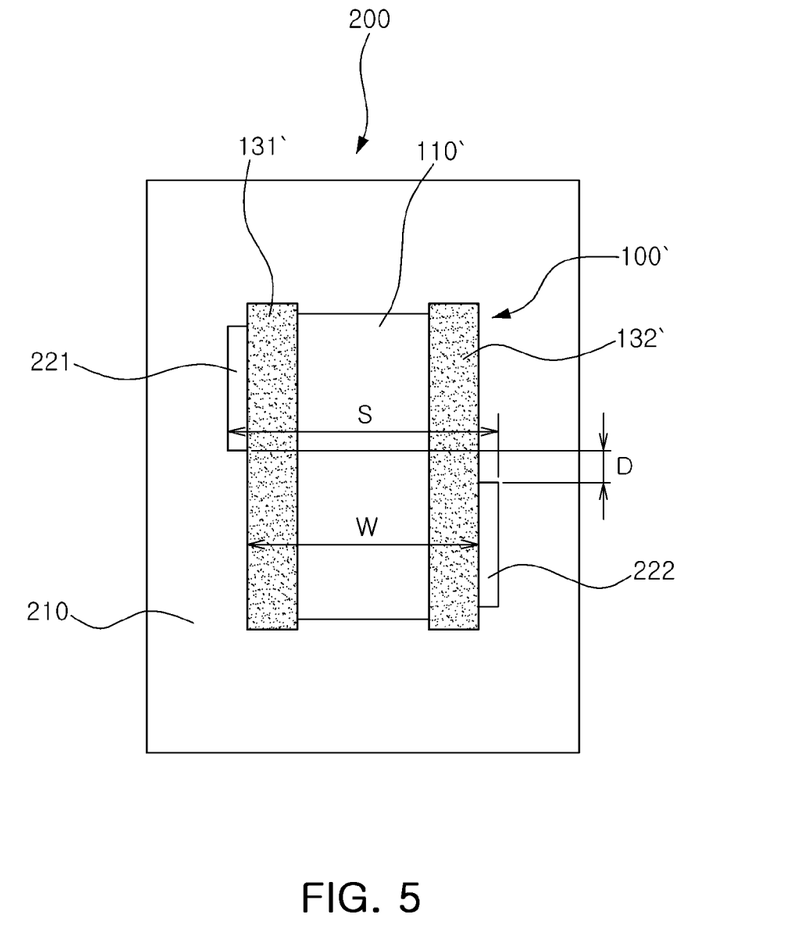
FIG. 5 is a plan view of a mounting circuit board of a multilayer ceramic capacitor according to another exemplary embodiment of the present disclosure.

FIG. 5 is a plan view of a mounting circuit board of a multilayer ceramic capacitor according to another exemplary embodiment of the present disclosure.

Referring to FIG. 5, in the multilayer ceramic capacitor 100' according to another exemplary embodiment of the present disclosure, a plurality of first and second internal electrodes may be formed to be alternately exposed to both side surfaces of a ceramic body 110'.

In addition, first and second external electrodes 131' and 132' may be extended from both side surfaces of the ceramic body 110' to a portion of a lower surface, a mounting surface, so as to contact exposed portions of the first and second internal electrodes.

Here, the same structure as that in the above-mentioned exemplary embodiment, for example, detailed descriptions of configurations of the printed circuit board 210 and the first and second electrode pads 221 and 222, arrangement positions thereof, or the like, will be omitted in order to avoid an overlapped description.

In a mounting circuit board 200 including the multilayer ceramic capacitor 100' mounted thereon according to the present exemplary embodiment, when a width of the ceramic body 110' is defined as W, and a distance from a front end of the first electrode pad 221 disposed on one side surface of the ceramic body 110' to a front end of the second electrode pad 222 disposed on the other side surface is defined as S, a ratio of W to S may satisfy 0.58≤W/S≤1.00.

TABLE 2

| # | W | S | W/S | Acoustic noise |
|---|---|---|-----|----------------|
| 1 | 700 um | 600 um | 1.17 | 32 dB |
| 2 | 700 um | 700 um | 1.00 | 27 dB |
| 3 | 700 um | 800 um | 0.88 | 24 dB |
| 4 | 700 um | 900 um | 0.78 | 23 dB |
| 5 | 700 um | 1000 um | 0.70 | 24 dB |
| 6 | 700 um | 1200 um | 0.58 | 28 dB |
| 7 | 700 um | 1500 um | 0.47 | 32 dB |

Referring to Table 2, it may be appreciated that in the cases of sample 7 in which a W/S value was less than 0.58 and sample 1 in which a W/S value was more than 1, acoustic noise was more than 30 dB.

For example, it may be appreciated that efficiency of transferring vibrations of the multilayer ceramic capacitor 100' to the board may be affected by an amount of the solder 230, and as shown in table 2, when the W/S value was excessively great or low, the amount of the solder 230 is excessively small or large, such that acoustic noise may be increased.

In the mounting circuit board 200 including the multilayer ceramic capacitor 100' mounted thereon according to the present exemplary embodiment, when an interval between the first and second electrode pads 221 and 222 in the length direction of the ceramic body 110' is defined as D, D may satisfy 50 μm≤D<300 μm.

TABLE 3

| # | D | Acoustic noise | Defect rate in Mounting |
|---|---|----------------|-------------------------|
| 1 | −20 um | 32 dB | Good |
| 2 | 0 um | 31 dB | Good |
| 3 | 20 um | 29 dB | Good |
| 4 | 50 um | 24 dB | Good |
| 5 | 70 um | 23 dB | Good |
| 6 | 250 um | 22 dB | Good |
| 7 | 300 um | 21 dB | Poor |

Table 3 above illustrates acoustic noise and a defect rate in mounting according to the D value.

Vibrations of the multilayer ceramic capacitor 100' may be transferred to the printed circuit board 210 through the first and second external electrodes 131 and 132 opposing each other and adhered to the printed circuit board 210. Referring to Table 3, when D was 50 μm or more, the efficiency of transferring vibrations of the multilayer ceramic capacitor 100' to the printed circuit board 210 may be decreased, such that acoustic noise may be decreased.

In addition, according to the present exemplary embodiment, since the first and second external electrodes 131 and 132 are asymmetrically mounted on the printed circuit board 210, when D was 300 μm or more, a mounting defect may occur.

Figure 6:
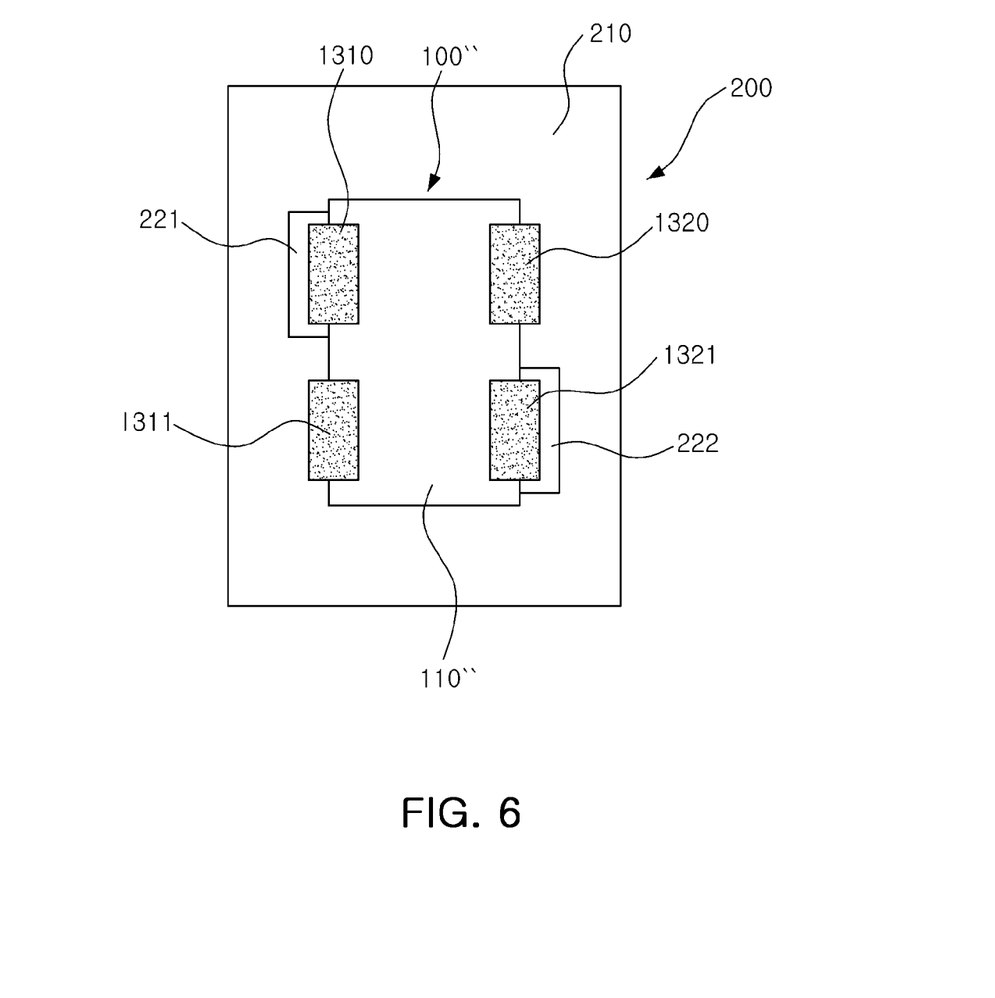
FIG. 6 is a plan view of a mounting circuit board of a multilayer ceramic capacitor according to another exemplary embodiment of the present disclosure

FIG. 6 is a plan view of a mounting circuit board of a multilayer ceramic capacitor according to another exemplary embodiment of the present disclosure.

Referring to FIG. 6, in a multilayer ceramic capacitor 100" according to another exemplary embodiment of the present disclosure, a pair of first external electrodes 1310 and 1311 and a pair of second external electrodes 1320 and 1321 may be formed to be spaced apart from each other in a length direction of a ceramic body 110".

In this case, horizontal directivity of the multilayer ceramic capacitor mounted on the printed circuit board may be removed.

Here, the same structure as that in the foregoing exemplary embodiment, for example, detailed descriptions of configurations of the printed circuit board 210 and the first and second electrode pads 221 and 222, arrangement positions thereof, and the like, will be omitted in order to avoid an overlapped description.

As set forth above, according to exemplary embodiments of the present disclosure, vibrations generated in the multilayer ceramic capacitor may be decreased by disposing the first and second electrode pads provided on the printed circuit board in positions diagonally opposed to each other, based on the ceramic body of the multilayer ceramic capacitor, whereby acoustic noise generated due to vibrations transferred to the printed circuit board may be decreased.

While exemplary embodiments have been shown and described above, it will be apparent to those skilled in the art that modifications and variations could be made without departing from the spirit and scope of the present disclosure as defined by the appended claims.

What is claimed is:

1. A mounting circuit board of a multilayer ceramic capacitor comprising:
    a multilayer ceramic capacitor including a ceramic body in which a plurality of dielectric layers are stacked, an active layer including a plurality of first and second internal electrodes alternately exposed to both side surfaces of the ceramic body, having the dielectric layer interposed therebetween, and first and second external electrodes extended from both side surfaces of the ceramic body to a portion of a lower surface thereof; and
    a printed circuit board having first and second electrode pads so that the first and second external electrodes of the multilayer ceramic capacitor are mounted thereon,
    wherein the first and second electrode pads are disposed in positions diagonally opposed to each other, based on the ceramic body of the multilayer ceramic capacitor,
    wherein $0.58 \leq W/S < 1.00$ in which W is a width of the ceramic body, and S is a distance between a front end of the first electrode pad disposed on one side surface of the ceramic body and a front end of the second electrode pad disposed on the other side surface.

2. The mounting circuit board of a multilayer ceramic capacitor of claim 1, wherein $50 \mu m \leq D \leq 300 \mu m$ in which D is an interval between the first and second electrode pads in the length direction of the ceramic body.

3. The mounting circuit board of a multilayer ceramic capacitor of claim 1, wherein the multilayer ceramic capacitor further includes:
    an upper cover layer formed on the active layer; and
    a lower cover layer, having a thickness thicker than that of the upper cover layer, formed below the active layer.

4. The mounting circuit board of a multilayer ceramic capacitor of claim 3, wherein in the multilayer ceramic capacitor, wherein $1.063 \leq (B+C)/A \leq 1.745$ in which A is a half of the entire thickness of the ceramic body, B is a thickness of the lower cover layer, and C is a half of the entire thickness of the active layer, and $(B+C)/A$ is a ratio of a central portion of the active layer deviating from a central portion of the ceramic body.

* * * * *